US011112186B2

(12) United States Patent
Watanabe et al.

(10) Patent No.: US 11,112,186 B2
(45) Date of Patent: Sep. 7, 2021

(54) HEAT PIPE HEATSINK WITH INTERNAL STRUCTURAL SUPPORT PLATE

(71) Applicant: FURUKAWA ELECTRIC CO., LTD., Tokyo (JP)

(72) Inventors: Yosuke Watanabe, Tokyo (JP); Kenya Kawabata, Tokyo (JP); Yoshikatsu Inagaki, Tokyo (JP); Tatsuro Miura, Tokyo (JP); Kazuaki Aotani, Tokyo (JP); Toshiaki Nakamura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/010,599

(22) Filed: Sep. 2, 2020

(65) Prior Publication Data

US 2020/0400381 A1 Dec. 24, 2020

Related U.S. Application Data

(63) Continuation of application No. PCT/JP2020/015595, filed on Apr. 7, 2020.

(30) Foreign Application Priority Data

Apr. 18, 2019 (JP) .............................. JP2019-079602

(51) Int. Cl.
*F28D 15/00* (2006.01)
*F28D 15/02* (2006.01)
*F28D 15/04* (2006.01)

(52) U.S. Cl.
CPC ..... *F28D 15/0275* (2013.01); *F28D 15/0266* (2013.01); *F28D 15/043* (2013.01)

(58) Field of Classification Search
CPC ............. F28D 15/0275; F28D 15/0266; F28D 15/043; F28D 15/04
See application file for complete search history.

(56) References Cited

U.S. PATENT DOCUMENTS 3,777,811 A * 12/1973 Shcosinger ............. F28D 15/04
165/104.13
3,820,596 A * 6/1974 Weinhardt et al. .........................
F28D 15/0233
165/104.26

(Continued)

FOREIGN PATENT DOCUMENTS

CN 1841265 A 10/2006
CN 2874398 Y 2/2007

(Continued)

OTHER PUBLICATIONS

International Search Report and Written Opinion of the International Searching Authority (Forms PCT/ISA/210 and PCT/ISA/237) for International Application No. PCT/JP2020/015595, dated Jul. 7, 2020.

(Continued)

*Primary Examiner* — Travis C Ruby
(74) *Attorney, Agent, or Firm* — Birch, Stewart, Kolasch & Birch, LLP (57) ABSTRACT

A heatsink including: a heat transport member having a heat receiving portion thermally connected to a heating element; and a heat radiating fin group which is connected to a heat radiating portion of the heat transport member and in which a plurality of heat radiating fins is arranged, wherein the heat transport member has an integral internal space that communicates from the heat receiving portion to the heat radiating portion and that is filled with a working fluid, a heat receiving portion inner surface area increasing portion and a supporting member are provided in an internal space of the heat receiving portion, and the supporting member is in surface contact with the heat receiving portion inner surface area increasing portion.

11 Claims, 5 Drawing Sheets

(56) References Cited

U.S. PATENT DOCUMENTS

| | | | | | |
|---|---|---|---|---|---|
| 4,489,777 | A | * | 12/1984 | Del Bagno | F28D 15/046 165/104.26 |
| 4,523,636 | A | * | 6/1985 | Meijer | F28D 15/0233 122/366 |
| 5,076,351 | A | * | 12/1991 | Munekawa | F28D 15/0283 165/104.21 |
| 5,522,455 | A | * | 6/1996 | Brown | F28D 15/0266 165/104.21 |
| 6,082,443 | A | * | 7/2000 | Yamamoto | F28D 15/0233 165/104.21 |
| 6,269,866 | B1 | * | 8/2001 | Yamamoto | F28D 15/0233 165/104.26 |
| 6,397,935 | B1 | * | 6/2002 | Yamamoto | F28D 15/0233 165/104.21 |
| 6,508,302 | B2 | * | 1/2003 | Ishida | B21C 37/151 165/104.21 |
| 7,044,201 | B2 | * | 5/2006 | Cho | F28D 15/0233 165/104.26 |
| 7,770,407 | B1 | * | 8/2010 | Haskell | F28D 15/0266 62/315 |
| 7,926,553 | B2 | * | 4/2011 | Dautert | G06F 1/20 165/104.14 |
| 8,042,606 | B2 | * | 10/2011 | Batty | F28D 15/0233 165/104.26 |
| 8,627,879 | B2 | * | 1/2014 | Rosenfeld | F28D 15/043 165/104.26 |
| 9,752,832 | B2 | * | 9/2017 | Kare | F28D 15/04 |
| 10,330,392 | B2 | * | 6/2019 | Liu | F28D 15/0266 |
| 10,371,457 | B2 | * | 8/2019 | Chen | F28F 1/24 |
| 10,677,535 | B1 | * | 6/2020 | Kawabata | H01L 23/427 |
| 2001/0022219 | A1 | * | 9/2001 | Ikeda | F28D 15/0233 165/46 |
| 2002/0007555 | A1 | * | 1/2002 | Ikeda | F28D 15/04 29/890.032 |
| 2003/0000683 | A1 | * | 1/2003 | Mast | F28D 1/06 165/104.26 |
| 2004/0022529 | A1 | * | 2/2004 | Lamb | F28D 15/0275 392/465 |
| 2004/0069461 | A1 | * | 4/2004 | Yuyama | H01L 23/427 165/104.26 |
| 2004/0163798 | A1 | | 8/2004 | Ghosh et al. | |
| 2005/0077030 | A1 | * | 4/2005 | Wong | F28D 15/043 165/104.26 |
| 2005/0098300 | A1 | * | 5/2005 | Kawabata | F28F 3/02 165/80.3 |
| 2005/0173098 | A1 | * | 8/2005 | Connors | F28D 15/0233 165/104.33 |
| 2005/0205239 | A1 | * | 9/2005 | Take | F28D 15/0266 165/80.3 |
| 2006/0086483 | A1 | * | 4/2006 | Hsu | F28D 15/046 165/104.26 |
| 2006/0162906 | A1 | * | 7/2006 | Hong | F28D 15/046 165/104.26 |
| 2006/0219387 | A1 | | 10/2006 | Atarashi et al. | |
| 2007/0193723 | A1 | * | 8/2007 | Hou | F28D 15/046 165/104.26 |
| 2007/0240858 | A1 | * | 10/2007 | Hou | F28D 15/046 165/104.26 |
| 2007/0240859 | A1 | * | 10/2007 | Wang | H01L 23/427 165/104.26 |
| 2007/0240860 | A1 | * | 10/2007 | Meyer, IV | F28D 15/0233 165/104.26 |
| 2007/0272399 | A1 | * | 11/2007 | Nitta | F28D 15/046 165/185 |
| 2008/0247137 | A1 | * | 10/2008 | Dautert | F28D 15/0266 361/703 |
| 2009/0194259 | A1 | * | 8/2009 | Meyer, IV | F28D 15/0233 165/104.26 |
| 2011/0088875 | A1 | * | 4/2011 | Hou | F28D 15/0266 165/104.26 |
| 2012/0048516 | A1 | * | 3/2012 | He | F28D 15/0233 165/104.26 |
| 2012/0073794 | A1 | * | 3/2012 | Chai | F28F 9/26 165/172 |
| 2012/0325438 | A1 | * | 12/2012 | Meyer, IV | F28D 15/0241 165/104.26 |
| 2013/0037242 | A1 | * | 2/2013 | Chen | F28D 15/0233 165/104.26 |
| 2013/0056178 | A1 | | 3/2013 | Matsunaga et al. | |
| 2013/0160977 | A1 | * | 6/2013 | Fan | F28D 15/04 165/104.26 |
| 2013/0174966 | A1 | * | 7/2013 | He | F28D 15/046 156/89.11 |
| 2014/0290929 | A1 | * | 10/2014 | Opila | H01L 23/345 165/287 |
| 2014/0345831 | A1 | * | 11/2014 | Lin | F28D 15/0233 165/104.26 |
| 2015/0060020 | A1 | * | 3/2015 | Yang | H01L 23/427 165/104.26 |
| 2016/0003555 | A1 | * | 1/2016 | Sun | F28D 15/0266 165/104.26 |
| 2016/0124474 | A1 | | 5/2016 | So et al. | |
| 2017/0122673 | A1 | * | 5/2017 | Chin | F28D 15/046 |
| 2017/0254600 | A1 | * | 9/2017 | Sun | F28D 15/046 |
| 2017/0303441 | A1 | * | 10/2017 | Farshchian | H05K 7/20309 |
| 2017/0307299 | A1 | * | 10/2017 | Huang | F28D 15/02 |
| 2017/0328610 | A1 | * | 11/2017 | Tao | F25B 21/02 |
| 2017/0330819 | A1 | * | 11/2017 | Tao | F25D 11/00 |
| 2017/0350657 | A1 | * | 12/2017 | Yeh | F28D 15/0233 |
| 2017/0356694 | A1 | * | 12/2017 | Tan | B23P 15/26 |
| 2018/0313611 | A1 | * | 11/2018 | Sasaki | F28D 15/046 |
| 2019/0045663 | A1 | * | 2/2019 | Shia | H05K 7/20409 |
| 2019/0249929 | A1 | | 8/2019 | Rush et al. | |
| 2019/0271511 | A1 | * | 9/2019 | Kishimoto | F28D 15/02 |
| 2020/0003501 | A1 | * | 1/2020 | Wakaoka | F28D 15/046 |
| 2020/0045847 | A1 | | 2/2020 | Wakaoka et al. | |
| 2020/0049418 | A1 | * | 2/2020 | Chu | H01L 23/427 |
| 2020/0049421 | A1 | * | 2/2020 | Wakaoka | F28F 3/02 |
| 2020/0060044 | A1 | * | 2/2020 | Numoto | F28D 15/0233 |
| 2020/0149823 | A1 | * | 5/2020 | Kawabata | B22F 7/08 |
| 2020/0236810 | A1 | | 7/2020 | Wakaoka et al. | |
| 2020/0400381 | A1 | * | 12/2020 | Watanabe | F28D 15/0266 |

FOREIGN PATENT DOCUMENTS

| | | |
|---|---|---|
| CN | 201758510 U | 3/2011 |
| CN | 201892459 U | 7/2011 |
| CN | 102869943 A | 1/2013 |
| CN | 206626989 U | 11/2017 |
| CN | 110132039 A | 8/2019 |
| JP | 55-102889 A | 8/1980 |
| JP | 10-209356 A | 8/1998 |
| JP | 2003-110072 A | 4/2003 |
| JP | 2003-322484 A | 11/2003 |
| JP | 2004-28442 A | 1/2004 |
| JP | 2016-92173 A | 5/2016 |
| TW | M412344 U1 | 9/2011 |
| WO | WO 2011/145618 A1 | 11/2011 |
| WO | WO 2018/198353 A1 | 11/2018 |

OTHER PUBLICATIONS

Japanese Office Action for corresponding Japanese Application No. 2019-079602, dated Sep. 18, 2019, with English translation.

Japanese Office Action for corresponding Japanese Application No. 2019-079602, drafted Jul. 10, 2019, with English translation.

Taiwanese Office Action and Search Report for corresponding Taiwanese Application No. 109112972, dated Jul. 2, 2020, with English translation of the Office Action.

English translation of the Written Opinion of the International Searching Authority (Forms PCT/IB/345, PCT/IB/310 and PCT/ISA/237) for International Application No. PCT/JP2020/015595, dated Jul. 7, 2020.

Chinese Office Action and Search Report for corresponding Chinese Application No. 202010305323.7, dated Mar. 29, 2021, with English translation of the Office Action.

* cited by examiner

HEAT PIPE HEATSINK WITH INTERNAL STRUCTURAL SUPPORT PLATE

CROSS REFERENCE TO RELATED APPLICATIONS

The present application is a continuation application of International Patent Application No. PCT/JP2020/15595 filed on Apr. 7, 2020, which claims the benefit of Japanese Patent Application No. 2019-79602, filed on Apr. 18, 2019. The contents of these applications are incorporated herein by reference in their entirety.

BACKGROUND

Technical Field

The present disclosure relates to a heatsink for cooling an electric/electronic component or the like, and more specifically relates to a heatsink having good pressure resistance and including a lightweight heat transport member.

Background

As a function of an electronic device is improved, heating elements such as electronic components are mounted on a substrate at high density inside the electronic device. There is a case where a heatsink is used as a means to cool a heating element such as an electronic component. Generally, a heatsink including a plurality of tubular heat pipes functioning as heat transport members (heat pipe-type heatsink) is used as the heatsink.

As a heat pipe-type heatsink, for example, there is a heat pipe-type heatsink in which many flat plate-like heat radiating fins are provided in a manner of being protruded to an outer peripheral surface of a plurality of tubular heat pipes (Japanese Patent Application Laid-Open No. 2003-110072). The heatsink in Japanese Patent Application Laid-Open No. 2003-110072 is a heatsink configured to transport heat of a heating element to a heat radiating fin by a heat transport function of a plurality of tubular heat pipes and to radiate the heat from the heat radiating fin. However, in the heatsink of Japanese Patent Application Laid-Open No. 2003-110072, when a heat pipe group including many heat pipes is thermally connected to a heating element, heat reception by the heat pipes cannot be equalized since an amount of heat received by the heat pipes varies depending on a distance from the heating element. Thus, there is a case where sufficient cooling performance is not acquired. Also, there is an R portion on an outer peripheral surface of each heat pipe, and a void generated on an outer side of the R portion does not contribute to heat transport by the heat pipe group. Thus, a volume of a heat receiving portion in the heat pipe group is not sufficiently acquired and there is also a case where sufficient cooling performance is not acquired.

Also, since an amount of heat generated by a heating element is increased along with an improvement in a function of an electronic device, a volume of a heat receiving portion of a heat pipe group is increased, in order to improve cooling performance, by a flattening process performed on tubular heat pipes, and parallel arrangement of flat portions of the heat pipes in a vertical direction.

On the other hand, since an inside of a heat transport member is a closed space on which depressurization processing is performed, it is required that a container of the heat transport member has pressure resistance against atmospheric pressure. When the pressure resistance of the container is insufficient, there is a case where the container is deformed by the atmospheric pressure and thermal connectivity between a heating element and a heat receiving portion of the container is impaired. Specifically, in a heat transport member having a plane portion such as a heat transport member on which a flattening process is performed, flatness is easily impaired by deformation due to the atmospheric pressure and thermal connectivity between a heating element and a heat receiving portion of a container is easily impaired.

However, when the container of the heat transport member is provided with a sufficient thickness in such a manner that pressure resistance against the atmospheric pressure is given to the container, weight of the container is increased, and a heating element such as an electronic component thermally connected to the container receives a stress from the container. When stress is applied to an electronic component or the like, performance of the electronic component or the like may be adversely affected.

Also, instead of increasing a thickness of a container, it is also considered to house a solid columnar member or block member in an entire internal space of the container to give pressure resistance against the atmospheric pressure to the container. However, when a solid columnar member or block member is housed in the entire internal space of the container, a stress from the columnar member or the block member is applied to an electronic component or the like thermally connected to the container since the solid columnar member or block member has a large weight although pressure resistance can be acquired. Furthermore, the columnar member or the block member may block a flow of a gas-phase working fluid in the internal space of the container.

SUMMARY

In view of the above situation, the present disclosure is to provide a heatsink that includes a lightweight heat transport member having good pressure resistance against atmospheric pressure without impairing flowability of a gas-phase working fluid and that can equalize a heat input in a heat receiving portion of the heat transport member.

A summary of a configuration of a heatsink of the present disclosure is as follows.

[1] A heatsink including:
a heat transport member having a heat receiving portion thermally connected to a heating element; and a heat radiating fin group which is connected to a heat radiating portion of the heat transport member and in which a plurality of heat radiating fins is arranged, wherein
the heat transport member has an integral internal space that communicates from the heat receiving portion to the heat radiating portion and that is filled with a working fluid, and
a heat receiving portion inner surface area increasing portion and a supporting member are provided in an internal space of the heat receiving portion, and the supporting member is in surface contact with the heat receiving portion inner surface area increasing portion.

[2] The heatsink according to [1], further including a heat transport member having the heat receiving portion thermally connected to the heating element, a pipe body connected to a heat radiating portion of the heat transport member, and a heat radiating fin group which is thermally connected to the pipe body and in which the plurality of heat radiating fins is arranged, wherein the heat transport member has an integral internal space that communicates from the heat receiving portion to a connection portion with the pipe body and that is filled with the working fluid, the internal space of the heat transport member communicating with an internal space of the pipe body, and the heat receiving portion inner surface area increasing portion and the supporting member are provided in an internal space of the heat receiving portion, and the supporting member is in surface contact with the heat receiving portion inner surface area increasing portion

[3] The heatsink according to [1] or [2], wherein the supporting member has a first flat plate portion in surface contact with the heat receiving portion inner surface area increasing portion, a second flat plate portion facing the first flat plate portion, and a third flat plate portion connecting the first flat plate portion and the second flat plate portion.

[4] The heatsink according to [3], wherein an area of the first flat plate portion is larger than an area of the second flat plate portion.

[5] The heatsink according to [3] or [4], wherein the third flat plate portion is extended in a heat transport direction of the heat transport member.

[6] The heatsink according to any one of [3] to [5], wherein the third flat plate portion is extended from each of one end and an other end in a width direction of the first flat plate portion, and the second flat plate portion is extended in an outer direction from the third flat plate portion.

[7] The heatsink according to any one of [3] to [5], wherein the third flat plate portion is extended from each of one end and an other end in a width direction of the first flat plate portion, and the second flat plate portion is extended in an inner direction from the third flat plate portion.

[8] The heatsink according to any one of [3] to [7], wherein a through hole is provided in the first flat plate portion.

[9] The heatsink according to any one of [3] to [8], wherein the first flat plate portion covers the entire heat receiving portion inner surface area increasing portion in planar view.

[10] The heatsink according to [2], wherein the pipe body is extended in an arrangement direction of the heat radiating fins.

[11] The heatsink according to [2], wherein an extension direction of the pipe body is not parallel to a heat transport direction of the heat transport member.

[12] The heatsink according to [2], wherein a plurality of the pipe bodies is provided and is extended in a plurality of directions from the heat transport member.

[13] The heatsink according to any one of [1] to [12], wherein at least one surface of the heat transport member has a planar shape.

In the above aspect, in a heat transport member, a part thermally connected to a heating element to be cooled functions as a heat receiving portion, and a part connected to a pipe body functions as a heat radiating portion of the heat transport member. A working fluid receives heat from a heating element and a phase of which is changed from a liquid phase to a gas phase in the heat receiving portion of the heat transport member, and a part of the gas-phase working fluid emits latent heat and the phase of which is changed from the gas phase to the liquid phase in the heat radiating portion of the heat transport member. In an aspect of a heatsink of the present disclosure, heat of a heating element is transported by a heat transport member from a heat receiving portion of the heat transport member to a heat radiating portion of the heat transport member, and is further transported from the heat radiating portion of the heat transport member to a pipe body. Also, a working fluid a phase of which is changed into the gas phase by reception of heat from the heating element by the heat transport member flows from the heat transport member to the pipe body. When the gas-phase working fluid flows from the heat transport member to the pipe body, the pipe body receives heat from the heat transport member and further transfers the heat received from the heat transport member to a heat radiating fin group. When the pipe body transfers the heat received from the heat transport member to the heat radiating fin group, the phase of the gas-phase working fluid flowing from the heat transport member to the pipe body is changed into the liquid phase. The heat transferred from the pipe body to the heat radiating fin group is released from the heat radiating fin group to an environment outside the heatsink. Also, in the above aspect, a supporting member such as a supporting member having a first flat plate portion, a second flat plate portion facing the first flat plate portion, and a third flat plate portion connecting the first flat plate portion and the second flat plate portion is provided in an internal space of a heat receiving portion, and the supporting member supports a container from an inner surface thereof.

In an aspect of a heatsink of the present disclosure, an entire internal space of a heat transport member having a heat receiving portion communicates and is integrated unlike an internal space of a heat pipe group in which a plurality of heat pipes is arranged in parallel. Thus, according to the aspect of the heatsink of the present disclosure in which heatsink the heat transport member having the integral internal space transports heat of a heating element from the heat receiving portion to a connection portion with a pipe body thermally connected to a heat radiating fin, a reflux characteristic of a liquid-phase working fluid is good, and a heat input in the heat receiving portion can be equalized and thermal resistance in the heat receiving portion can be reduced even when an amount of heat generated by the heating element is increased. Also, according to an aspect of the heatsink of the present disclosure, a supporting member that is in surface contact with a heat receiving portion inner surface area increasing portion supports a container from an inner surface thereof. Thus, a lightweight heat transport member having pressure resistance against atmospheric pressure can be acquired. Also, according to an aspect of the heatsink of the present disclosure, a supporting member having a first flat plate portion in surface contact with a heat receiving portion inner surface area increasing portion, a second flat plate portion facing the first flat plate portion, and a third flat plate portion connecting the first flat plate portion and the second flat plate portion supports a container from an inner surface thereof. Thus, a lightweight heat transport member having good pressure resistance with respect to atmospheric pressure can be acquired. Also, according to an aspect of the heatsink of the present disclosure, the supporting member includes the flat plate portions. Thus, it is possible to prevent flowability of a gas-phase working fluid from being impaired.

According to an aspect of the heatsink of the present disclosure, an area of the first flat plate portion in surface contact with the heat receiving portion inner surface area increasing portion is larger than an area of the second flat plate portion. Thus, deformation of the container in a part to which the heating element is thermally connected is more securely prevented, and thermal connectivity between the heat receiving portion of the heat transport member and the heating element is further improved.

According to an aspect of the heatsink of the present disclosure, the third flat plate portion is extended in a heat transport direction of the heat transport member. Thus, with the supporting member, it is possible to more securely prevent flowability of a gas-phase working fluid from being impaired.

According to an aspect of the heatsink of the present disclosure, the third flat plate portion is extended from each of one end and the other end in a width direction of the first flat plate portion, and the second flat plate portion is extended in an outer direction from the third flat plate portion. Thus, fixing stability of the supporting member with respect to the container is improved.

According to an aspect of the heatsink of the present disclosure, the third flat plate portion is extended from each of one end and the other end in a width direction of the first flat plate portion, and the second flat plate portion is extended in an inner direction from the third flat plate portion. Thus, it is possible to downsize the heat transport member.

According to an aspect of the heatsink of the present disclosure, a through hole is provided in the first flat plate portion. Thus, a gas-phase working fluid can smoothly flow from the heat receiving portion inner surface area increasing portion to an internal space of the heat receiving portion.

According to an aspect of the heatsink of the present disclosure, the pipe body communicating with the internal space of the heat transport member is extended in an arrangement direction of the heat radiating fin. Thus, a gas-phase working fluid flows in the arrangement direction of the heat radiating fin in the pipe body. Thus, heat radiation efficiency of the heat radiating fin group is improved, and cooling performance of the heatsink is securely improved.

According to an aspect of the heatsink of the present disclosure, an extension direction of the pipe body is not parallel to the heat transport direction of the heat transport member. Thus, heat transported from the heat transport member is transported in a direction different from the extension direction (that is, heat transport direction) of the heat transport member. Thus, it is possible to prevent an increase in a size of the heatsink in the extension direction of the heat transport member. As a result, a space can be saved.

According to an aspect of the heatsink of the present disclosure, a plurality of the pipe bodies is extended in a plurality of directions from the heat transport member. Thus, heat transported from the heat transport member to the pipe bodies is transported in the plurality of directions different from the extension direction of the heat transport member. Thus, it is possible to more securely prevent an increase in a size of the heatsink in the extension direction of the heat transport member.

DETAILED DESCRIPTION

Figure 1:
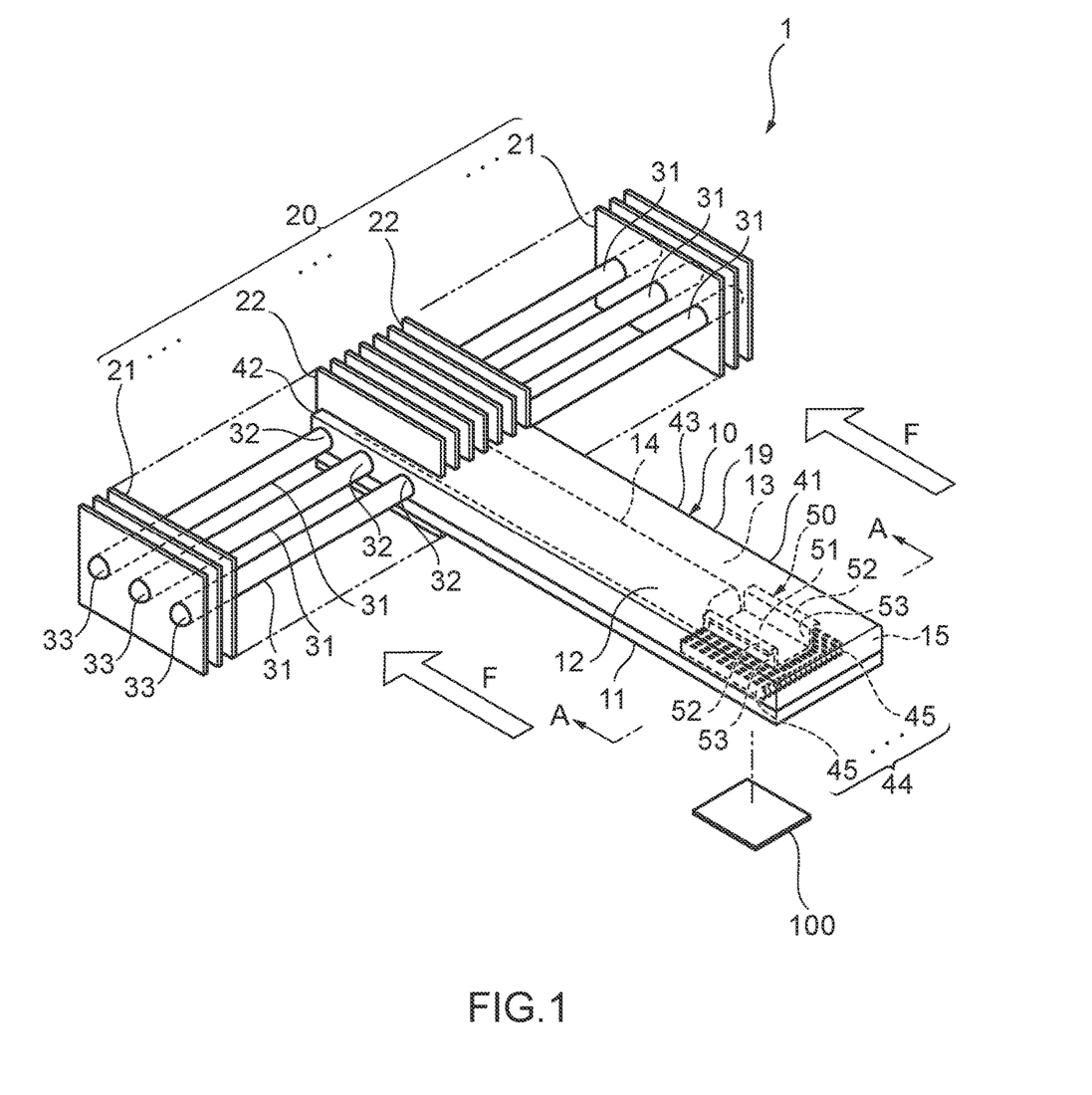
FIG. 1 A perspective view for describing an outline of a heatsink according to a first embodiment of the present disclosure.
Figure 2:
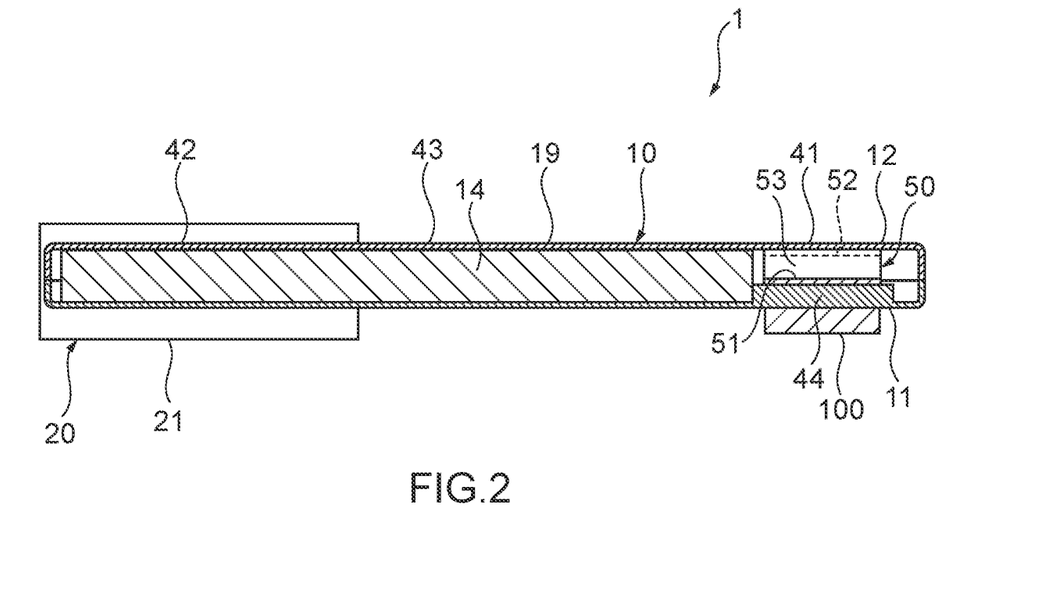
FIG. 2 A side sectional view for describing the outline of the heatsink according to the first embodiment of the present disclosure.
Figure 3:
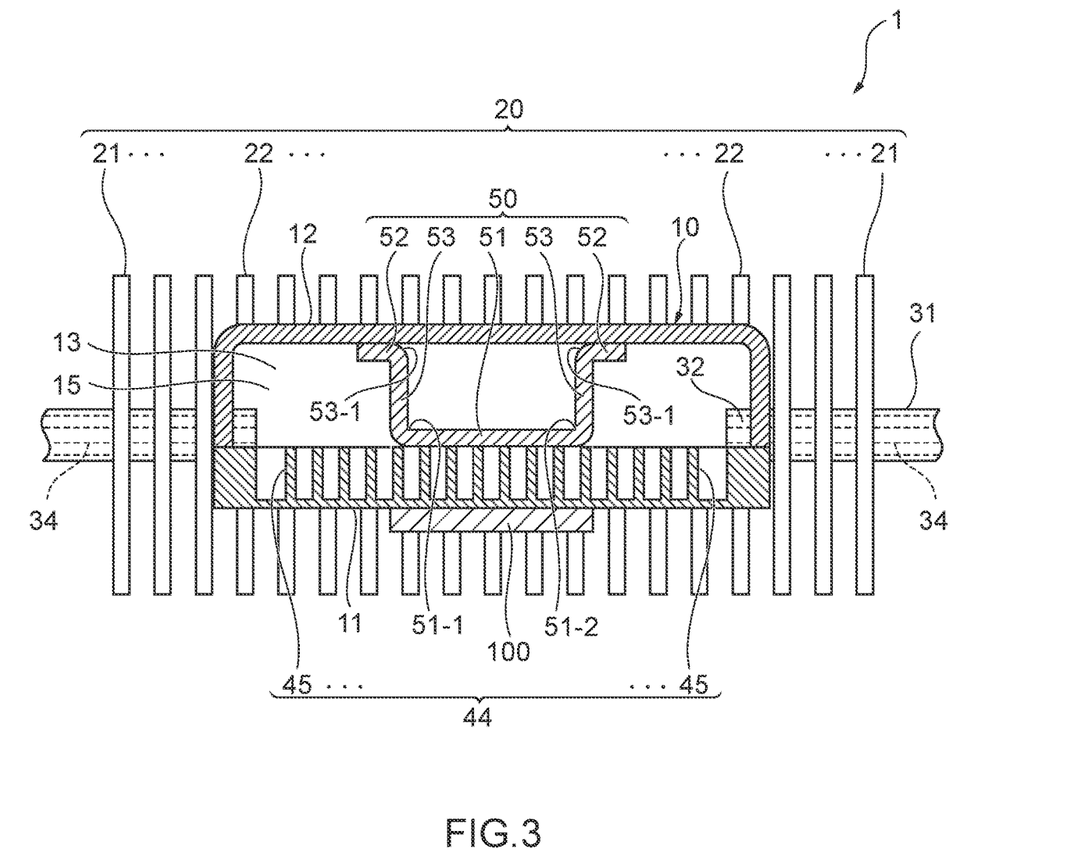
FIG. 3 An A-A sectional view of FIG. 1, the view being for describing the outline of the heatsink according to the first embodiment of the present disclosure.
Figure 4:
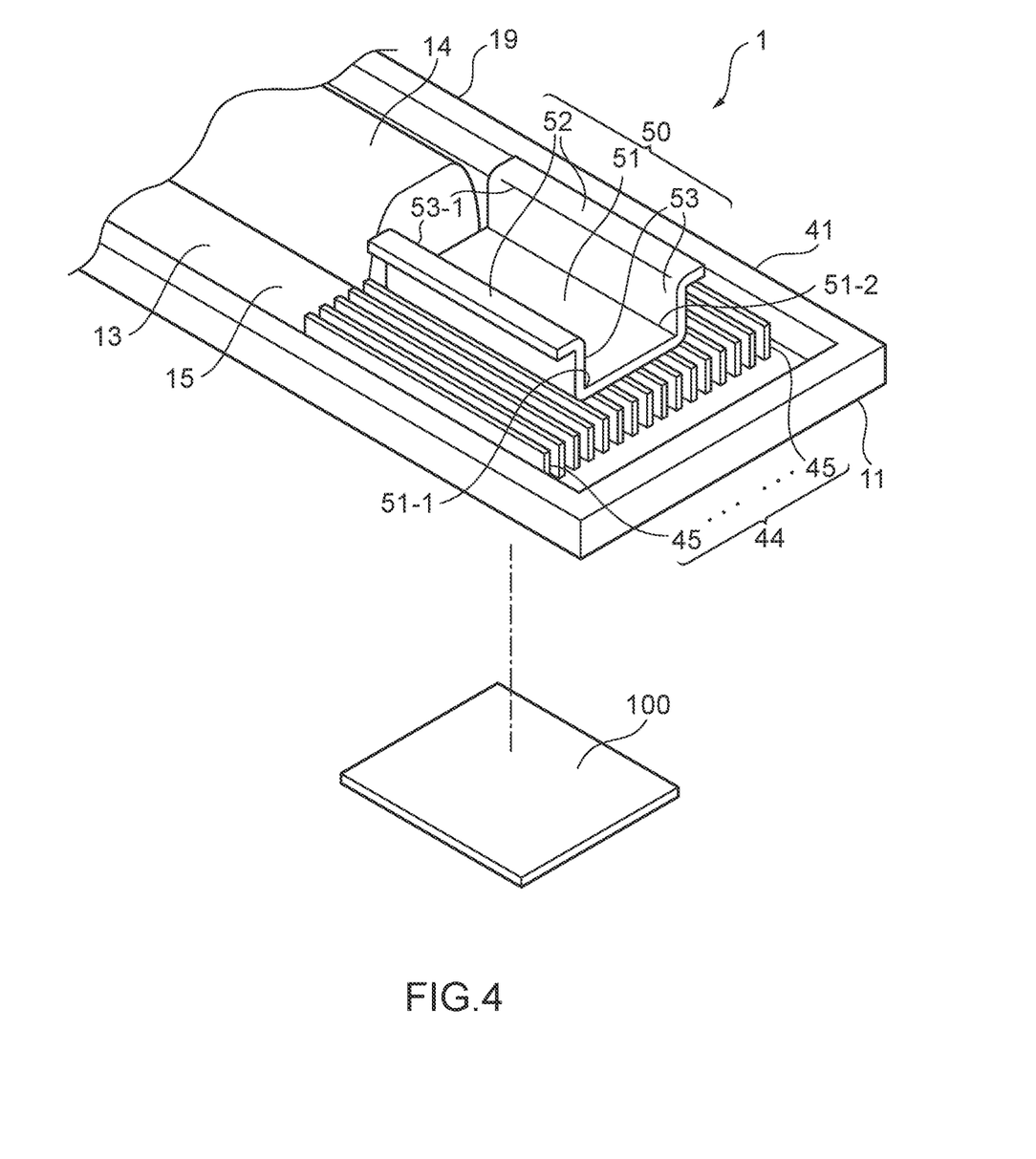
FIG. 4 A view for describing an outline of an inside of a heat receiving portion of the heatsink according to the first embodiment of the present disclosure.

In the following, heatsinks according to embodiments of the present disclosure will be described with reference to the drawings. First, a heatsink according to a first embodiment of the present disclosure will be described. Note that FIG. 1 is a perspective view for describing an outline of the heatsink according to the first embodiment of the present disclosure. FIG. 2 is a side sectional view for describing the outline of the heatsink according to the first embodiment of the present disclosure. FIG. 3 is an A-A sectional view of FIG. 1, the view being for describing the outline of the heatsink according to the first embodiment of the present disclosure. FIG. 4 is a view for describing an outline of an inside of a heat receiving portion of the heatsink according to the first embodiment of the present disclosure.

As illustrated in FIGS. 1 and 2, a heatsink 1 according the first embodiment of the present disclosure includes a heat transport member 10 having a heat receiving portion 41 that is thermally connected to a heating element 100, a heat radiating fin group 20 thermally connected to the heat transport member 10, and a pipe body 31 thermally connected to the heat radiating fin group 20. The heat radiating fin group 20 includes a plurality of first heat radiating fins 21, 21, . . . attached to the pipe body 31, and a plurality of second heat radiating fins 22, 22, . . . attached to the heat transport member 10. In a heat radiating portion 42 of the heat transport member 10, the pipe body 31 is connected to the heat transport member 10. Also, an internal space of the heat transport member 10 communicates with an internal space of the pipe body 31. That is, in the heatsink 1, the heat transport member 10 has an integral internal space that communicates from the heat receiving portion 41 to a connection portion with the pipe body 31 and that is filled with a working fluid.

The heat transport member 10 includes a container 19 having a hollow cavity 13 and a working fluid (not illustrated) flowing in the cavity 13. Also, a wick structure 14 having capillary force is housed in the cavity 13. The container 19 is formed by joining of one plate-like body 11 placed on a side of an installation surface of the heatsink 1 and the other plate-like body 12 facing one plate-like body 11.

One plate-like body 11 is a plate-like member having a side wall erected from a plane portion at an edge of the plane portion. The other plate-like body 12 also has a plate-like member having a side wall erected from a plane portion at an edge of the plane portion. Thus, each of the one plate-like body 11 and the other plate-like body 12 has a recessed shape. The cavity 13 of the container 19 is formed by joining of the one plate-like body 11 and the other plate-like body 12 with the recessed shapes facing each other. Thus, a shape of the container 19 is planar. The cavity 13 of the container 19 is an internal space that is sealed from an external environment, and is depressurized by deaeration processing.

A part of an outer surface of the container 19 to which part the heating element 100 to be cooled is thermally connected functions as the heat receiving portion 41. Since the heating element 100 is thermally connected to the container 19, the heating element 100 is cooled by the heatsink 1. In the heatsink 1, the heating element 100 is attached to an outer surface of the one plate-like body 11 among the outer surfaces of the container 19. In the heat transport member 10, the heat receiving portion 41 is formed at one end since the heating element 100 is thermally connected to the one end. Also, on an inner surface of the container 19, a heat receiving portion inner surface area increasing portion 44 is provided in the heat receiving portion 41. The heat receiving portion inner surface area increasing portion 44 is a part in which recesses and protrusions are repeatedly formed. In the heatsink 1, by provision of a plurality of plate-like fins 45, 45 . . . in an erected manner on an inner surface of the one plate-like body 11, the heat receiving portion inner surface area increasing portion 44 is formed. Since the heat receiving portion 41 is provided with the heat receiving portion inner surface area increasing portion 44, heat transfer from the heat receiving portion 41 to a liquid-phase working fluid becomes smooth.

The heat transport member 10 is extended in a predetermined direction from a position of the heating element 100, and a plurality of second heat radiating fins 22, 22, . . . included in the heat radiating fin group 20 is thermally connected to the other end facing the one end. The other end of the heat transport member 10 to which the heat radiating fin group 20 is thermally connected functions as the heat radiating portion 42 of the heat transport member 10. The cavity 13 is extended from the heat receiving portion 41 to the heat radiating portion 42.

In the heat transport member 10, an intermediate portion placed between the heat receiving portion 41 placed at the one end of the container 19 and the heat radiating portion 42 placed at the other end of the container 19 functions as a heat insulating portion 43. The heat insulating portion 43 of the heat transport member 10 is a part to which neither the heat radiating fin group 20 nor the heating element 100 is thermally connected. Heat transferred from the heating element 100 to the heat receiving portion 41 is transported from the heat receiving portion 41 to the heat radiating portion 42 in an extension direction of the heat insulating portion 43.

A size in a width direction of the heat transport member 10 is not specifically limited, and can be selected according to an installation space, a use condition, and the like of the heatsink 1. The heat receiving portion 41, the heat insulating portion 43, and the heat radiating portion 42 have substantially the same size in the heatsink 1. A size in the width direction of the heat transport member 10 in the heat receiving portion 41 can be arbitrarily selected according to a size in a width direction of the heating element 100, or the like. Also, in the heatsink 1, the heat receiving portion 41, the heat insulating portion 43, and the heat radiating portion 42 are placed on the same plane.

As illustrated in FIGS. 1 to 4, a supporting member 50 is provided in the heat receiving portion 41 in the cavity 13. The supporting member 50 is installed on the heat receiving portion inner surface area increasing portion 44. Also, the supporting member 50 is provided in a region of the heat receiving portion inner surface area increasing portion 44 in planar view.

The supporting member 50 has a first flat plate portion 51, a second flat plate portion 52 facing the first flat plate portion 51, and a third flat plate portion 53 connecting the first flat plate portion 51 and the second flat plate portion 52. Thus, the third flat plate portion 53 is continuous with the first flat plate portion 51 and the second flat plate portion 52. The supporting member 50 is formed of a thin plate-shaped flat plate portion.

The first flat plate portion 51 is in surface contact with a top of the heat receiving portion inner surface area increasing portion 44. Also, the first flat plate portion 51 is extended along the heat receiving portion inner surface area increasing portion 44. From the above, the first flat plate portion 51 presses the one plate-like body 11 in the heat receiving portion 41 via the heat receiving portion inner surface area increasing portion 44. In the heatsink 1, the first flat plate portion 51 of the supporting member 50 is provided in a part of a region of the heat receiving portion inner surface area increasing portion 44 in planar view. An area of the first flat plate portion 51 in planar view is smaller than an area of the heat receiving portion inner surface area increasing portion 44 in planar view. The "planar view" refers to a state of being viewed in a direction vertical to the heat transport direction of the heat transport member 10 and in a direction vertical to a plane portion of the heat transport member 10.

As illustrated in FIGS. 3 and 4, in the supporting member 50, the third flat plate portion 53 is extended, from each of one end 51-1 in a width direction and the other end 51-2 in the width direction of the first flat plate portion 51, in a direction vertical to a plane of the first flat plate portion 51. Also, the third flat plate portion 53 is extended in the heat transport direction of the heat transport member 10, that is, in a direction from the heat receiving portion 41 to the heat radiating portion 42. From the above, a longitudinal direction of the third flat plate portion 53 is extended in the heat transport direction of the heat transport member 10. Also, the first flat plate portion 51 and the second flat plate portion 52 are extended from one end to the other end in the longitudinal direction of the third flat plate portion 53. In the supporting member 50, the third flat plate portion 53 is not provided in a width direction that is a direction orthogonal to the heat transport direction of the heat transport member 10.

The second flat plate portions 52 is extended in an outer direction from a top 53-1 of each third flat plate portion 53. Also, the second flat plate portion 52 is extended in a direction substantially parallel to the first flat plate portion 51 and in a direction vertical to the third flat plate portion 53. The second flat plate portion 52 is in surface contact with an inner surface of the other plate-like body 12 among inner surfaces of the container 19. Thus, the supporting member 50 supports the heat receiving portion 41 from the inner surface of the container 19 between an inner surface of the one plate-like body 11 and the inner surface of the other plate-like body 12, more specifically, between the top of the heat receiving portion inner surface area increasing portion 44 and the other plate-like body 12. Thus, in the heatsink 1, it is possible to give pressure resistance against atmospheric pressure to the heat transport member 10 while reducing a thickness of the container 19.

Although a relationship between the area of the first flat plate portion 51 in planar view and an area of the second flat plate portion 52 in planar view is not specifically limited, an aspect that the area of the first flat plate portion 51 in planar view is larger than the total area of the second flat plate portions 52 in planar view is employed in the heatsink 1. Since the area of the first flat plate portion 51 in planar view is larger than the total area of the second flat plate portions 52 in planar view, deformation of the container 19 in the heat receiving portion 41 is more securely prevented. Thus, thermal connectivity between the heat receiving portion 41 of the heat transport member 10 and the heating element 100 is further improved.

As illustrated in FIGS. 1 and 2, the wick structure 14 is extended from one end to the other end of the container 19. In the heatsink 1, the extension is from an end portion on a side of the heat radiating portion 42 of the heat receiving portion inner surface area increasing portion 44 formed at the one end of the container 19 to the other end of the container 19. The wick structure 14 is not specifically limited, and examples thereof include a sintered body of metal powder such as copper powder, a metal mesh made of a metal wire, a groove (plurality of narrow groove), a nonwoven fabric, a metal fiber, and the like. In the heat transport member 10, a sintered body of metal powder is used as the wick structure 14. A part of the cavity 13 in which part the wick structure 14 is not provided functions as a steam flow channel 15 through which a gas-phase working fluid flows. The steam flow channel 15 is extended from one end to the other end of the container 19 in such a manner as to correspond to the wick structure 14 extended from the one end to the other end of the container 19. The heat transport member 10 transports heat of the heating element 100, which heat is received by the heat receiving portion 41, from the heat receiving portion 41 to the heat radiating portion 42 by a heat transport characteristic due to an operation of the working fluid.

As illustrated in FIGS. 1 to 3, pipe bodies 31 internal spaces of which communicate with the cavity 13 of the container 19 are provided at the other end of the heat transport member 10. Thus, a space from the cavity 13 to the inside of the pipe bodies 31 is filled with the working fluid flowing in the cavity 13. A shape of the pipe bodies 31 is not specifically limited, and has a linear shape in a longitudinal direction and has a circular shape in a direction orthogonal to the longitudinal direction (in radial direction) in the heatsink 1. Also, all of the pipe bodies 31 have substantially the same shape and size.

The pipe bodies 31 are extended in a direction substantially orthogonal to the heat transport direction of the heat transport member 10 along a plane direction of the heat transport member 10. In such a manner, in the heatsink 1, heat transported from the heat transport member 10 is transported by the pipe bodies 31 in a direction different from the extension direction of the heat transport member 10 since the extension direction of the pipe bodies 31 is not parallel to the heat transport direction of the heat transport member 10. Thus, it is possible to prevent an increase in a size of the heatsink 1 in the extension direction (heat transport direction) of the heat transport member 10 and to save a space of the heatsink 1.

Also, the plurality of the pipe bodies 31 is provided and is extended in a plurality of directions from the heat transport member 10. In the heatsink 1, the pipe bodies 31 are extended in both right and left directions, that is, two directions with the heat transport member 10 as a center. Also, the same number of pipe bodies 31 are respectively provided in the right and left directions with the heat transport member 10 as the center (three in FIGS. 1 and 2). Since the plurality of pipe bodies 31 is extended from the heat transport member 10 in a plurality of directions (two direction in heatsink 1), heat transported from the heat transport member 10 is transported in a plurality of directions different from the extension direction of the heat transport member 10. Thus, an increase in a size of the heatsink 1 in the extension direction of the heat transport member 10 can be more securely prevented.

An end portion 32 on a side of the cavity 13 (hereinafter, also referred to as "base portion") of each of the pipe bodies 31 is opened, and an end portion 33 on an opposite side to the cavity 13 (hereinafter, also referred to as "leading-end portion") is closed. Also, the cavity 13 of the container 19 and an internal space of the pipe body 31 communicate with each other, and the internal space of the pipe body 31 is depressurized by deaeration processing as in the case of the cavity 13. Thus, a working fluid can flow between the cavity 13 of the container 19, on which the depressurization processing is performed, and the internal spaces of the pipe bodies 31.

A through hole (not illustrated) for attachment of a pipe body 31 to the container 19 is formed in a side surface portion of the container 19. A shape and size of the through hole correspond to a shape and size of the pipe body 31. By insertion of the base portion 32 of the pipe body 31 into the through hole of the container 19, the pipe body 31 is connected to the container 19. Thus, the pipe body 31 and the container 19 include different members. A method of fixing the pipe body 31 attached to the container 19 is not specifically limited, and examples thereof include welding, soldering, brazing, and the like.

In the heatsink 1, the pipe body 31 and the heat transport member 10 include different members. Thus, an arrangement, shape, size, and the like of the pipe body 31 can be freely selected, and a degree of freedom in designing of the heatsink 1 is improved. Also, in the heatsink 1, since the pipe body 31 can be connected to the container 19 by insertion of the pipe body 31 into the through hole in the container 19, assembly is easy.

As illustrated in FIG. 3, a different wick structure 34 that generates capillary force and is different from the wick structure 14 housed in the container 19 is provided on the inner surface of the pipe body 31. The different wick structure 34 is not specifically limited, and examples thereof include a sintered body of metal powder such as copper powder, a metal mesh made of a metal wire, a plurality of narrow grooves (groove), a nonwoven fabric, a metal fiber, and the like. In the pipe body 31, a plurality of narrow grooves is formed as the wick structure 34 in such a manner as to cover the entire inner surface of the pipe body 31. The narrow grooves are extended from the base portion 32 to the leading-end portion 33 of the pipe body 31 in the longitudinal direction of the pipe body 31.

Also, when necessary, the wick structure 14 provided in the heat transport member 10 may be connected to the different wick structure 34, which is provided in the pipe body 31, via a connection member (not illustrated) having capillary force. A working fluid a phase of which is changed from a gas phase to a liquid phase inside the pipe body 31 flows back from the leading-end portion 33 of the pipe body 31 in a direction of the base portion 32 in the different wick structure 34 by the capillary force of the different wick structure 34 in the pipe body 31. The liquid-phase working fluid that flows back to the base portion 32 of the pipe body 31 flows from the different wick structure 34 to one end of the connection member. The liquid-phase working fluid that flows from the different wick structure 34 to the one end of the connection member can flow from the one end to the other end in the connection member, and can flow back from the other end of the connection member to the wick structure 14 of the heat transport member 10. By the connection member, a working fluid a phase of which is changed to a liquid phase inside the pipe body 31 can more smoothly flow back from the pipe body 31 to the heat transport member 10. Examples of the connection member include a wick member, more specifically, a metal mesh, a braided metal wire, a metal fiber, and the like.

Examples of materials of the container 19, the supporting member 50, and the pipe body 31 include copper, a copper alloy, aluminum, an aluminum alloy, nickel, a nickel alloy, stainless steel, titanium, and the like. The working fluid to fill the cavity 13 of the container 19 and the internal space of the pipe body 31 can be arbitrarily selected according to compatibility with the materials of the container 19, the supporting member 50, and the pipe body 31, and examples thereof include water, fluorocarbons, hydrofluoroether (HFE), cyclopentane, ethylene glycol, a mixture thereof, and the like. Also, the supporting member 50 can be formed by a bending process of a flat plate-like member.

A thickness of the container 19 can be arbitrarily selected according to mechanical strength, weight, and the like, and examples thereof include a thickness of 2.0 to 5.0 mm. Also, a thickness of the container 19 can be reduced and is, for example, 0.5 to 1.0 mm. A width of the container 19 can be, for example, 4 to 20 mm. Also, a diameter of the pipe body 31 can be arbitrarily selected according to mechanical strength, weight, and the like and can be, for example, 5 to 10 mm.

As illustrated in FIG. 1, in the heat radiating fin group 20, a plurality of first heat radiating fins 21, 21, . . . and a plurality of second heat radiating fins 22, 22, . . . are formed and arranged in parallel. Both the first heat radiating fins 21 and the second heat radiating fins 22 are thin flat plate-like members. First heat radiating fins 21 placed on both side portions in the heat radiating fin group 20 are arranged in parallel at a predetermined interval in a direction substantially parallel to a longitudinal direction of pipe bodies 31. Thus, the pipe bodies 31 are extended in an arrangement direction of the first heat radiating fins 21, and a gas-phase working fluid flows inside the pipe bodies 31 in the arrangement direction of the first heat radiating fins 21. Also, the first heat radiating fins 21 are respectively attached and fixed to positions of the pipe bodies 31, and are thermally connected to the pipe bodies 31. Thus, heat radiation efficiency of the heat radiating fin group 20 is improved, and cooling performance of the heatsink 1 is securely improved. All of the first heat radiating fins 21 have the same shape and size. The second heat radiating fins 22 placed in a central portion of the heat radiating fin group 20 are attached and fixed to the position of the heat transport member 10, and is thermally connected to the heat transport member 10. A part of the heat transport member 10 to which part the second heat radiating fins 22 are attached functions as the heat radiating portion 42. The second heat radiating fins 22 are attached in an erected state to the heat transport member 10.

A main surface of each of the first heat radiating fins 21 is a surface that mainly has a heat radiating function of the first heat radiating fin 21. A main surface of each of the second heat radiating fins 22 is a surface that mainly has a heat radiating function of the second heat radiating fin 22. Each of the main surfaces of the first heat radiating fins 21 and the main surfaces of the second heat radiating fins 22 is arranged in such a manner as to be in a direction substantially orthogonal to the extension direction, that is, the longitudinal direction of the pipe bodies 31. A method of thermally connecting the first heat radiating fins 21 to the pipe bodies 31 is not specifically limited, and any known method can be used. For example, a method of forming through holes (not illustrated) in the first heat radiating fins 21 and inserting the pipe bodies 31 into the through holes is used. A method of thermally connecting the second heat radiating fins 22 to the heat transport member 10 is not specifically limited, and any known method can be used. For example, a method of providing the heat radiating fins 22 in an erected manner in the heat transport member 10 by providing, at end portions of the second heat radiating fins 22, fixing pieces extended in a direction vertical to the main surfaces of the second heat radiating fins 22 and by connecting these fixing pieces to a plane at the other end of the heat transport member 10 can be used.

The heatsink 1 is forcibly air-cooled by a blower fan (not illustrated), for example. As illustrated in FIG. 1, cooling air F derived from the blower fan is supplied in a direction substantially parallel to the heat transport direction of the heat transport member 10. The cooling air F is supplied along the main surfaces of the first heat radiating fins 21 and the main surfaces of the second heat radiating fins 22, and the heat radiating fin group 20 is cooled.

A material of the first heat radiating fins 21 and the second heat radiating fins 22 is not specifically limited, and examples thereof include metal such as copper, a copper alloy, aluminum, and an aluminum alloy, a carbon material such as graphite, a composite member using the carbon material, and the like.

Next, a mechanism of a cooling function of the heatsink 1 will be described with reference to FIGS. 1 to 3. First, the heating element 100 that is an object to be cooled is thermally connected to one end of the container 19 (one end of one plate-like body 11) of the heat transport member 10, and the one end is made to function as the heat receiving portion 41. When the one end of the container 19 receives heat from the heating element 100, the heat is transferred to the liquid-phase working fluid in the cavity 13, the fluid including a liquid-phase working fluid that fills the heat receiving portion inner surface area increasing portion 44, at the one end of the container 19 and the liquid-phase working fluid is changed into a gas-phase working fluid in the cavity 13 at the one end of the container 19. The gas-phase working fluid flows in the steam flow channel 15 from the one end of the container 19 to the other end that is the heat radiating portion 42. When the gas-phase working fluid flows from the one end to the other end of the container 19, the heat transport member 10 transports the heat from the one end to the other end. A part of the gas-phase working fluid that flows to the other end of the container 19 emits latent heat and is changed into a liquid-phase working fluid, and the released latent heat is transferred to the second heat radiating fins 22 thermally connected to the heat transport member 10. The heat transferred to the second heat radiating fins 22 is released to an external environment of the heatsink 1 from the second heat radiating fins 22. The working fluid the phase of which is changed into the liquid phase at the other end of the container 19 flows back from the other end of the container 19 to one end of the container 19 by capillary force of the wick structure 14.

Also, since the cavity 13 of the container 19 and the internal spaces of the pipe bodies 31 communicate with each other, a working fluid a phase of which is not changed into the liquid phase at the other end of the container 19 in the gas-phase working fluid changed from the liquid-phase working fluid flows from the cavity 13 into the internal spaces of the pipe bodies 31. The gas-phase working fluid that flows into the internal spaces of the pipe bodies 31 releases latent heat inside the pipe bodies 31 and is changed into the liquid-phase working fluid. The latent heat released inside the pipe body 31 is transferred to the first heat radiating fins 21 that are thermally connected to the pipe bodies 31. The heat transferred to the first heat radiating fins 21 is released to the external environment of the heatsink 1 from the first heat radiating fins 21. The working fluid the phase of which is changed from the gas phase into the liquid phase inside the pipe bodies 31 flows back from the central portions and the leading-end portions 33 of the pipe bodies 31 to the base portions 32 of the pipe bodies 31 by the capillary force of the different wick structures 34 in the inner surfaces of the pipe bodies 31. The liquid-phase working fluid that flows back to the base portions 32 of the pipe bodies 31 flows back to the wick structure 14 from the different wick structures 34 at the other end of the container 19. The liquid-phase working fluid that flows back to the wick structure 14 flows back to the one end of the container 19 from the other end of the container 19 by the capillary force of the wick structure 14.

In the heatsink 1, the entire cavity 13 of the heat transport member 10 communicates and is integrated unlike an internal space of the heat pipe group in which a plurality of heat pipes is arranged in parallel. Thus, in the heatsink 1, since the heat transport member 10 having the integral cavity 13 transports heat of the heating element 100 from the heat receiving portion 41 to the connection portion with the pipe bodies 31 thermally connected to the heat radiating fin group 20, a reflux characteristic of a liquid-phase working fluid is good, and a heat input in the heat receiving portion 41 can be equalized and thermal resistance in the heat receiving portion 41 can be reduced even when an amount of heat generated by the heating element 100 is increased. Also, in the heatsink 1, since the supporting member 50 supports the heat receiving portion 41 from the inner surface of the container 19 between the top of the heat receiving portion inner surface area increasing portion 44 and the inner surface of the other plate-like body 12, it is possible to give good pressure resistance against atmospheric pressure to the heat transport member 10 without increasing a thickness of the container 19. As a result, a weight of the heat transport member 10 can be reduced. By reducing the weight of the heat transport member 10, it is possible to prevent stress from the container 19 from being applied to the heating element 100 thermally connected to the container 19. As a result, an adverse effect on performance of the heating element 100 can be prevented.

Also, in the heatsink 1, the third flat plate portions 53 are extended in the heat transport direction of the heat transport member 10. Thus, with the supporting member 50, it is possible to more securely prevent flowability of the gas-phase working fluid in the heat receiving portion 41 from being impaired. Also, since the supporting member 50 is formed of the flat plate portions, it is possible to prevent the flowability of the gas-phase working fluid in the heat receiving portion 41 from being impaired.

Also, in the heatsink 1, the third flat plate portion 53 is extended from each of the one end 51-1 in the width direction and the other end 51-2 in the width direction of the first flat plate portion 51, and the second flat plate portion 52 is extended in an outer direction from the third flat plate portion 53. Thus, fixing stability of the supporting member 50 to the container 19 is improved.

Also, in the heatsink 1, since the entire internal space of the heat transport member 10 communicates and is integrated, the entire heating element 100 can be uniformly cooled even when heat is generated unevenly in the heating element 100.

Figure 5:
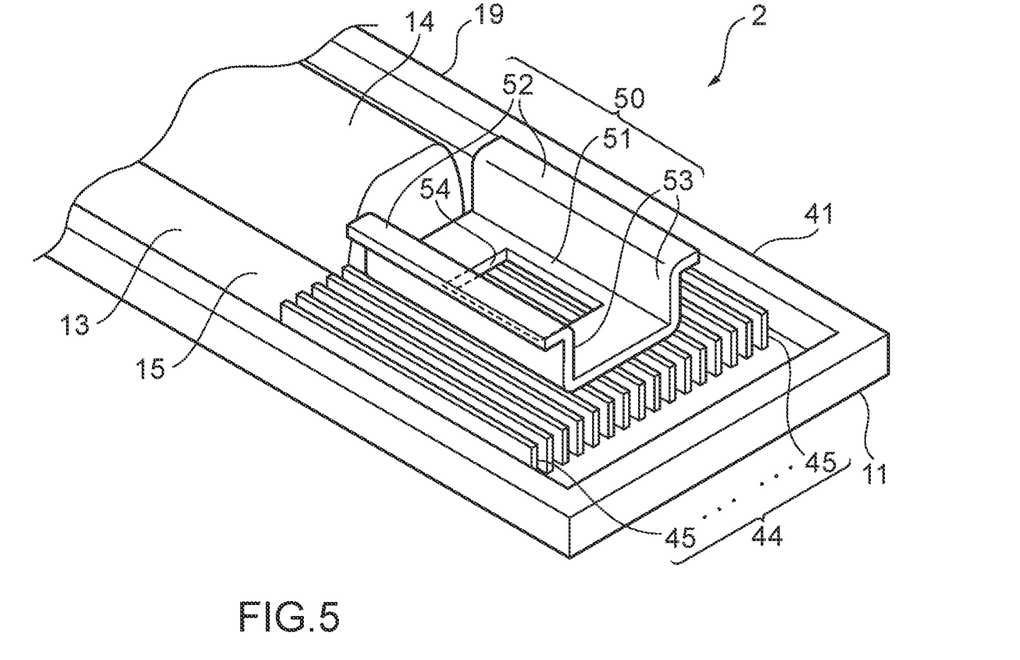
FIG. 5 A perspective view for describing a supporting member used for a heatsink according to a second embodiment of the present disclosure.

Next, a heatsink according to a second embodiment of the present disclosure will be described with reference to the drawing. Note that since the heatsink according to the second embodiment has a main portion in common with that of a heatsink according to the first embodiment, the same reference sign is used to describe the same component. Note that FIG. 5 is a perspective view for describing a supporting member used for the heatsink according to the second embodiment of the present disclosure.

In a heatsink 2 according to the second embodiment, a through hole 54 is provided in a first flat plate portion 51 of a supporting member 50. The through hole 54 is a through hole in a thickness direction of the first flat plate portion 51. Also, the through hole 54 is provided at a substantially central portion of the first flat plate portion 51. A part of a heat receiving portion inner surface area increasing portion 44 is exposed from the through hole 54.

In the heatsink 2, a working fluid a phase of which is changed from a liquid phase to a gas phase in the heat receiving portion inner surface area increasing portion 44 can smoothly flow from the heat receiving portion inner surface area increasing portion 44 to a steam flow channel 15 since the through hole 54 is provided in the first flat plate portion 51.

Figure 6:
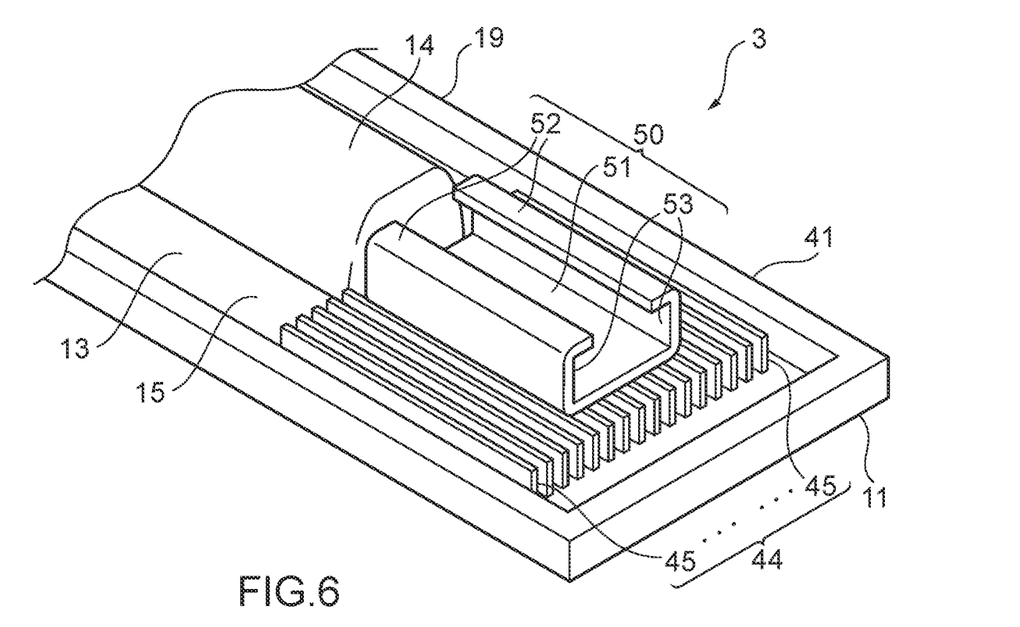
FIG. 6 A perspective view for describing a supporting member used for a heatsink according to a third embodiment of the present disclosure.

Next, a heatsink according to a third embodiment of the present disclosure will be described with reference to the drawing. Note that since the heatsink according to the third embodiment has a main portion in common with those of heatsinks according to the first and second embodiments, the same reference sign is used to describe the same component. Note that FIG. 6 is a perspective view for describing a supporting member used for the heatsink according to the third embodiment of the present disclosure.

In a heatsink according to each of the first and second embodiments, a second flat plate portion is extended in an outer direction from a third flat plate portion. Alternatively, as illustrated in FIG. 6, a second flat plate portion 52 of a supporting member 50 is extended in an inner direction from a third flat plate portion 53 in a heatsink 3 according to the third embodiment.

In the heatsink 3, since the second flat plate portion 52 is extended in an inner direction from the third flat plate portion 53, a container 19 can be downsized.

Next, a different embodiment of a heatsink of the present disclosure will be described in the following. In a heatsink of each of the above embodiments, a pipe body an internal space of which communicates with a cavity of a container is connected to a heat transport member, and first heat radiating fins of a heat radiating fin group are thermally connected to the pipe body. However, no pipe body may be connected to a heat transport member. Thus, no first heat radiating fin may be provided in a heat radiating fin group. Also, in the heatsink of each of the above embodiments, one supporting member in which a longitudinal direction of a third flat plate portion is extended in a heat transport direction of the heat transport member is provided. Alternatively, a plurality of supporting members may be provided in a heat transport direction of a heat transport member. That is, the supporting member may be divided and provided in the heat transport direction of the heat transport member. In this case, a plurality of supporting members may be provided on a heat receiving portion inner surface area increasing portion. Also, although being provided only in a heat receiving portion of the heat transport member in the heatsink of each of the above embodiments, a supporting member may be provided in a heat receiving portion and a heat insulating portion and/or a heat radiating portion of a heat transport member instead. That is, supporting members may be provided in a plurality of places of the heat transport member. Since the supporting members are provided in the plurality of places of the heat transport member, deformation of a container is more securely prevented, and a decrease in a flow channel of a working fluid such as a steam flow channel is prevented. Also, a supporting member may be provided only in a part other than a heat receiving portion of a heat transport member, that is, only in a heat insulating portion and/or a heat radiating portion of the heat transport member.

In the heatsink according to the first embodiment, the supporting member has an aspect that an area of the first flat plate portion in planar view is larger than a total area of the second flat plate portions in planar view. Alternatively, a total area of second flat plate portions in planar view may be larger than an area of a first flat plate portion in planar view. Also, in the heatsink according to the third embodiment, a through hole in a thickness direction of a first flat plate portion of a supporting member may be provided in the first flat plate portion.

In the heatsink of the first embodiment, the supporting member is provided in a part of the region of the heat receiving portion inner surface area increasing portion in planar view. Alternatively, an aspect that a first flat plate portion of a supporting member corresponds to an entire region of a heat receiving portion inner surface area increasing portion may be employed. That is, the first flat plate portion of the supporting member may cover the entire heat receiving portion inner surface area increasing portion in planar view. In this case, an area of the first flat plate portion in planar view is equal to an area of the heat receiving portion inner surface area increasing portion in planar view. Also, in planar view, a first flat plate portion of a supporting member may be extended not only to an entire region of a heat receiving portion inner surface area increasing portion but also to the outside of the region of the heat receiving portion inner surface area increasing portion. That is, in planar view, the first flat plate portion of the supporting member may not only cover the entire heat receiving portion inner surface area increasing portion, but may be also extended in an outer direction from the heat receiving portion inner surface area increasing portion. In this case, an area of the first flat plate portion 51 in planar view is larger than an area of the heat receiving portion inner surface area increasing portion 44 in planar view.

In a heatsink of each of the above embodiments, a supporting member having a first flat plate portion in surface contact with a heat receiving portion inner surface area increasing portion, a second flat plate portion facing the first flat plate portion, and a third flat plate portion connecting the first flat plate portion and the second flat plate portion is used. Alternatively, a solid columnar member or block member may be used as a supporting member on a heat receiving portion inner surface area increasing portion.

Since including a lightweight heat transport member that has good pressure resistance against atmospheric pressure without impairing flowability of a gas-phase working fluid, a heatsink of the present disclosure is highly useful in a field of cooling an electronic component that is mounted on a circuit board and that generates a large amount of heat, the component being an electronic component such as a central processing unit, for example.

What is claimed is:
1. A heatsink comprising:
a heat transport member having a heat receiving portion thermally connected to a heating element; and a plurality of second heat radiating fins connected to a heat radiating portion of the heat transport member, wherein
the heat transport member has an integral internal space that communicates from the heat receiving portion to the heat radiating portion and that is filled with a working fluid, and
a heat receiving portion inner surface area increasing portion formed by provision of a plurality of plate-like fins in an erected manner on an inner surface of the heat transport member, and a supporting member having a first flat plate portion that is in surface contact with the plurality of plate-like fins, a second flat plate portion facing the first flat plate portion, and a third flat plate portion connecting the first flat plate portion and the second flat plate portion are provided in an internal space of the heat receiving portion,
wherein a wick structure extended from the heat receiving portion to the heat radiating portion is housed in the internal space of the heat transport member, and the wick structure is housed in a portion different from the portion of the heat receiving portion inner surface area increasing portion, and the supporting member is not the wick structure.

2. The heatsink according to claim 1, further comprising a pipe body connected to the heat radiating portion of the heat transport member, and a plurality of first heat radiating fins thermally connected to the pipe body, wherein
the internal space of the heat transport member communicates with an internal space of the pipe body.

3. The heatsink according to claim 2, wherein the pipe body is extended in an arrangement direction of the first heat radiating fins.

4. The heatsink according to claim 2, wherein an extension direction of the pipe body is not parallel to a heat transport direction of the heat transport member.

5. The heatsink according to claim 2, wherein a plurality of the pipe bodies is provided and is extended in a plurality of directions from the heat transport member.

6. The heatsink according to claim 1, wherein an area of the first flat plate portion is larger than an area of the second flat plate portion.

7. The heatsink according to claim 1, wherein the third flat plate portion is extended in a heat transport direction of the heat transport member.

8. The heatsink according to claim 1, wherein the third flat plate portion is extended from each of one end and an other end in a width direction of the first flat plate portion, and the second flat plate portion is extended in an outer direction from the third flat plate portion.

9. The heatsink according to claim 1, wherein the third flat plate portion is extended from each of one end and an other end in a width direction of the first flat plate portion, and the second flat plate portion is extended in an inner direction from the third flat plate portion.

10. The heatsink according to claim 1, wherein a through hole is provided in the first flat plate portion.

11. The heatsink according to claim 1, wherein at least one surface of the heat transport member has a planar shape.

* * * * *